United States Patent
Sharma

(10) Patent No.: US 9,413,383 B1
(45) Date of Patent: Aug. 9, 2016

(54) DELTA SIGMA MODULATOR APPARATUS AND METHOD TO MITIGATE DAC ERROR INDUCED OFFSET AND EVEN ORDER HARMONIC DISTORTION

(71) Applicant: Texas Instruments Incorporated, Dallas, TX (US)

(72) Inventor: Bhupendra Sharma, Bengaluru (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/816,272

(22) Filed: Aug. 3, 2015

(51) Int. Cl.
*H03M 3/00* (2006.01)
*H03M 1/00* (2006.01)

(52) U.S. Cl.
CPC ................ *H03M 3/51* (2013.01); *H03M 1/002* (2013.01); *H03M 3/384* (2013.01)

(58) Field of Classification Search
CPC ....... H03M 3/51; H03M 1/002; H03M 3/384; H03M 3/34
USPC .................................................. 341/155, 143
See application file for complete search history.

(56) References Cited

U.S. PATENT DOCUMENTS

| | | | |
|---|---|---|---|
| 4,939,516 A | 7/1990 | Early | |
| 4,994,804 A * | 2/1991 | Sakaguchi | H03M 3/34 341/143 |
| 4,994,805 A | 2/1991 | Dedic et al. | |
| 5,039,989 A | 8/1991 | Welland et al. | |
| 5,148,167 A * | 9/1992 | Ribner | H03M 3/414 341/143 |
| 6,639,532 B1 | 10/2003 | Liu et al. | |
| 7,538,705 B2 * | 5/2009 | Deval | H03M 3/34 341/118 |
| 7,999,710 B2 * | 8/2011 | Matthews | H03M 3/34 341/143 |
| 2004/0141562 A1 * | 7/2004 | Plisch | H03F 1/02 375/259 |
| 2007/0013566 A1 * | 1/2007 | Chuang | H03M 3/34 341/143 |
| 2009/0079607 A1 | 3/2009 | Denison et al. | |
| 2011/0063146 A1 | 3/2011 | Matthews et al. | |

* cited by examiner

*Primary Examiner* — Jean B Jeanglaude
(74) *Attorney, Agent, or Firm* — Lawrence J. Bassuk; Frank D. Cimino

(57) ABSTRACT

Delta sigma modulators, apparatus and methods mitigate DAC error induced offset and even order harmonic distortion in a delta sigma modulator by chopping a digital output stream of a forward circuit path using a digital modulator or digital chopper circuit in a feedback circuit to create a DAC digital input signal responsive to a chopper clock signal having a clock rate lower than a DSM quantizer clock signal, and chopping a differential DAC output signal using an analog chopper circuit responsive to the chopper clock signal to provide a differential feedback signal to a forward circuit path of the DSM to mitigate DAC error induced offset and even order harmonic distortion in the digital output stream.

20 Claims, 6 Drawing Sheets

DELTA SIGMA MODULATOR APPARATUS AND METHOD TO MITIGATE DAC ERROR INDUCED OFFSET AND EVEN ORDER HARMONIC DISTORTION

TECHNICAL FIELD

The present disclosure relates generally to delta sigma modulation, and more particularly to methods and apparatus for mitigating digital to analog converter (DAC) error induced offset and even order harmonic distortion in delta sigma modulators.

BACKGROUND

Many modern electrical systems include digital circuitry along with analog to digital converters (ADCs or A/Ds) to interface with analog signals such as temperature, pressure, voice, etc., or modulated carriers transmitting information over some medium (analog or digital communication). For many systems, particularly battery-powered user devices, energy efficiency is important. Delta sigma architectures are widely used for high resolution, low speed ADCs as well as for medium resolution, high-speed ADCs. Continuous time delta sigma modulators (CTDSM) are often used for high speed applications requiring a moderate number of bits and are very popular because of their simple design and low power consumption. Continuous time delta sigma modulators include a digital to analog converter (DAC) in feedback circuit to complete a delta sigma loop. A common CTDSM topology is a cascade of integrators and feedback (CIFB) DAC.

Achieving high linearity in high-speed DACs is difficult without very good matching in feedback DACs. Feedback DAC mismatch errors directly contribute to even order harmonic distortion. These errors can be caused by mismatched DAC switches, mismatched clock duty cycles and/or mismatched clock signal rise and fall times. DAC switches, such as MOS transistors are typically biased in saturation to avoid any inadvertent shorting of virtual ground. Switch threshold voltage mismatch or mismatch in switch turn on/off time along with DAC current source parasitic capacitance can lead to imbalance in differential current in forward path integrators of a DSM. Moreover, clock duty cycle mismatch can cause mismatch in current integration. These mismatch errors degrade the DSM operation. For example, mismatch in a CTDSM differential feedback circuit path can lead to high offset errors in the digital output stream of the delta sigma modulator as well as even order harmonic distortion in the DSM output. These DAC error induced offset and even order harmonic distortion problems and poor linearity are not acceptable in many high-speed and high performance systems like automotive radar applications.

Prior solutions include calibrating mismatch errors by creating intentional imbalance in DAC switch drive circuitry in order to cancel out the mismatch effects. In these solutions, offsets are measured and the DAC switch drive levels are trimmed until the mismatch cancels out to a desired level. However, such calibration is done during assembly and testing and requires significant test time to measure non-linearity and then apply a trim code to individual electronic components. Also, the process is iterative may require multiple iterations thereby increasing manufacturing time and cost. Furthermore, mismatch variation across temperature cannot be corrected by these assembly calibration codes, and production calibration does not reduce flicker noise contribution due to DAC switch mismatch.

SUMMARY

In described examples, apparatus is provided for mitigating DAC-induced offsets and/or harmonic distortion, including a digital chopper circuit coupled in a DSM feedback circuit to selectively invert a digital output stream of a DSM quantizer to provide a DAC digital input signal responsive to a chopper clock signal. The apparatus further includes a DAC and an analog chopper circuit to provide a differential feedback signal according to the differential DAC output signal with alternating polarity responsive to the chopper clock signal for summation with a differential analog input signal of the DSM. In certain examples, the apparatus includes a clock circuit to provide the chopper clock signal at a lower switching frequency than the quantizer clock signal. In disclosed examples, DAC related offset and even order harmonic distortion are up-modulated for filtering by decimation filtering with other out of band noise without affecting the forward signal path. Disclosed examples can reduce significant calibration test time in production and reduce product cost in contrast to calibrating mismatch errors during manufacturing. Moreover, disclosed examples provide error correction in real time, and thus errors across temperature can be corrected without external intervention. In addition to correcting even harmonics, disclosed examples also up-modulate DAC switch flicker noise.

In certain examples, the integrator includes a transconductance amplifier and the DAC includes a current source and first and second switches coupled between the current source and the transconductance amplifier inputs to selectively offset current provided to one of the transconductance amplifier inputs.

Certain examples include a return to zero (RZ) DAC providing a zero differential DAC output signal during a reset period between output transitions from one state to another, and the clock circuit prevents chopper clock transitions outside the reset period so that states of the analog and digital chopper circuits only transition during the reset period while the first and second DAC outputs provide a zero differential DAC output signal.

In certain examples, second or higher order DSMs are provided, including multiple integrators connected in the forward circuit between a first integrator and the quantizer, and at least one further DAC in the feedback circuit to provide a differential DAC output signal to an input of a second or subsequent integrator. In some examples, analog chopper circuits are provided following one or more inner-loop feedback DACs.

DETAILED DESCRIPTION

Figure 1:
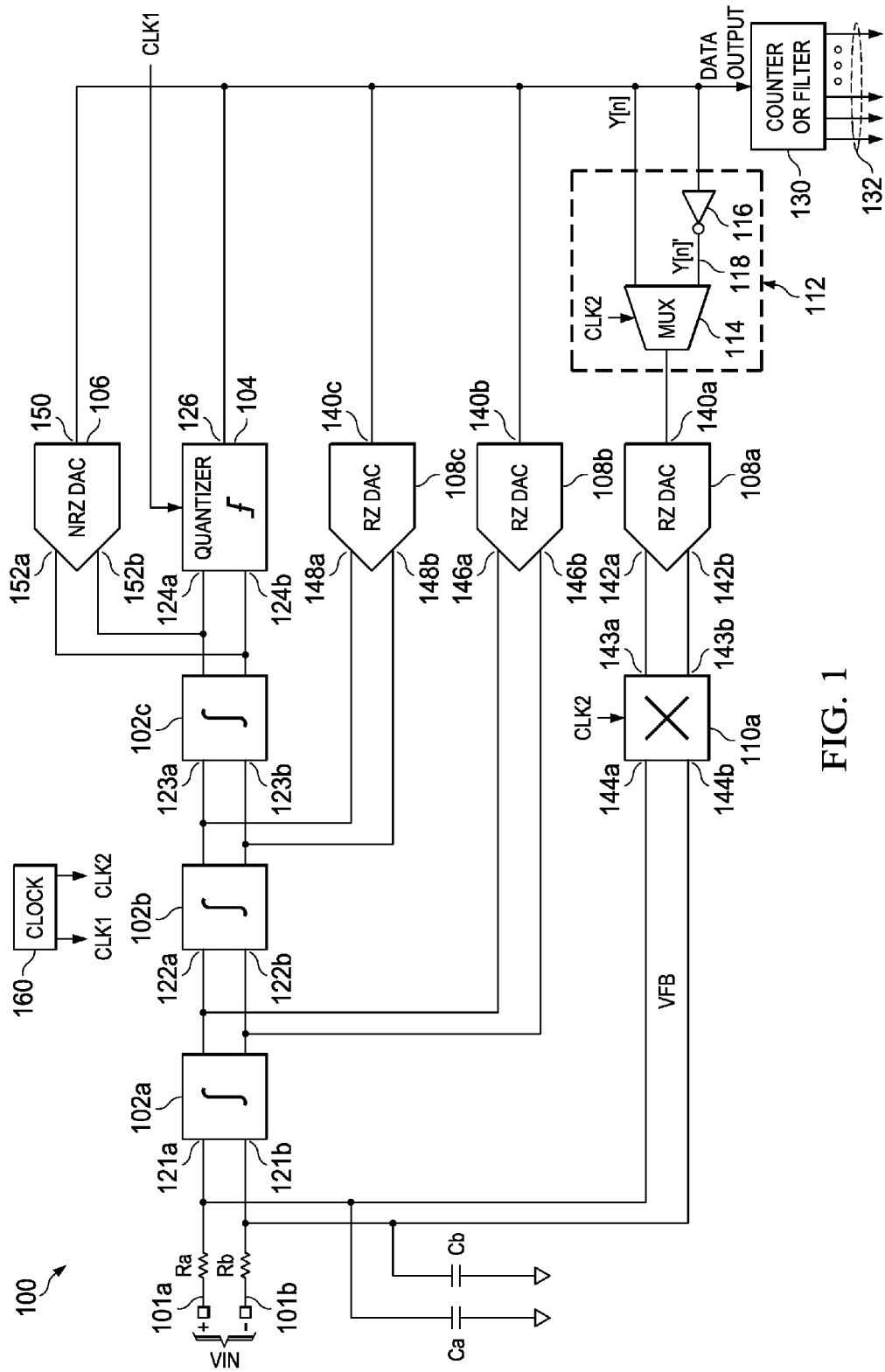
FIG. 1 is a schematic diagram of a first continuous time delta sigma modulator example including a digital chopper circuit operative to chop a DAC digital input signal and an analog chopper circuit operative to chop a differential DAC output signal in the DSM feedback circuit for noise shaping DAC errors.

In the drawings, like reference numerals refer to like elements throughout, and the various features are not necessarily drawn to scale.

Figure 2:
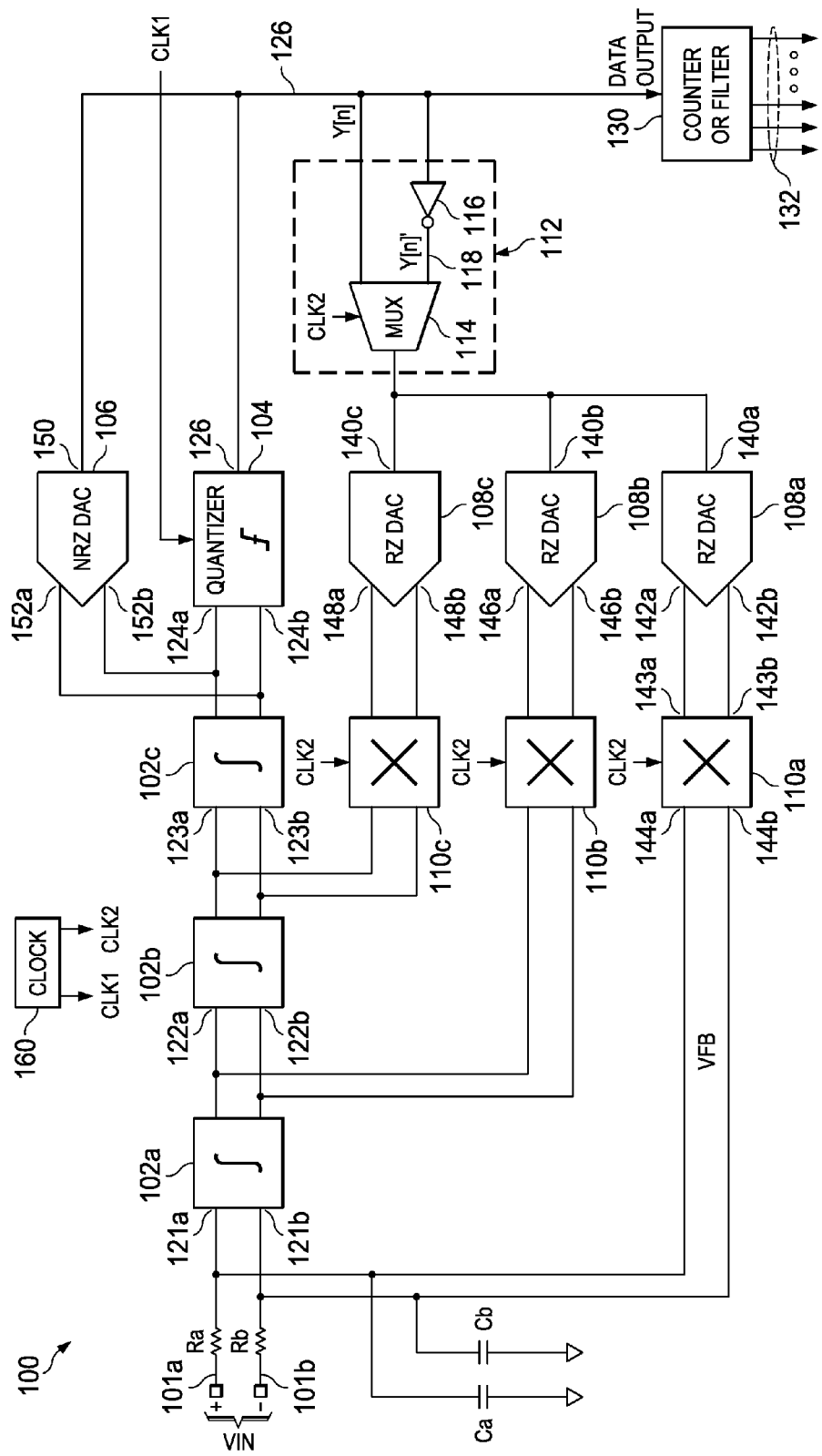
FIG. 2 is a schematic diagram of a second continuous time DSM example with digital and analog chopper circuits in the feedback circuit.

FIGS. 1 and 2 show a third order continuous time delta sigma modulator 100 in an analog to digital converter for providing a digital output stream Y[n] that can be filtered to provide a digital output value representing a differential analog input voltage VIN. The DSM 100 in one example is an integrated circuit (IC) and provides a forward circuit path including a summer circuit operative to sum the input signal VIN received at input terminals 101a and 101b with a differential feedback signal VFB to provide a differential summer output signal. In the example of FIGS. 1 and 2, an RC input circuit is provided between the input terminals 101 and the first integrator 102a, including resistors Ra and Rb as well as capacitors Ca and Cb to provide low pass filtering for the received analog input signal VIN. The forward path of the DSM 100 also includes three differential integrator circuits 102a, 102b and 102c followed by a quantizer 104 to provide third order DSM forward path circuitry. The quantizer 104 provides a digital output stream to an input 150 of a non-return to zero (NRZ) DAC 106, which provides a differential analog feedback signal via first and second outputs 152a and 152b to the inputs 124a and 124b of the quantizer 104. In one example, the DAC 106 is a three tap finite impulse response (FIR) DAC. The first integrator 102a includes first and second integrator inputs 121a and 121b to receive the differential summer output signal as well as first and second integrator outputs to provide a first differential integrator output signal by integrating the summer output signal. In this example, the second integrator 102b includes first and second integrator inputs 122a and 122b to receive a differential integrator output signal from the first integrator 102a, and provides a differential integrator output to integrator inputs 123a and 123b of the third integrator circuit 102c. The output of the third integrator 102c is summed with the output of the NRZ DAC 106 to provide a differential input voltage to the inputs 124a and 124b of the quantizer 104.

The DSM 100 in FIG. 1 is a third order CTDSM. Single order examples are possible including a single integrator 102 in the forward circuit path followed by a quantizer 104. In other examples, two or more integrator circuits 102 are provided in the forward DSM circuit path followed by a quantizer 104 to form a second or higher order modulator circuit. The DSM 100 in FIGS. 1 and 2, includes a feedback circuit with a return to zero (RZ) feedback DAC 108a, an analog chopper circuit 110, and a digital chopper circuit or digital modulator 112 forming an apparatus to mitigate digital to analog converter DAC error induced offset and even order harmonic distortion. In one example, the DAC 108a is a three tap FIR DAC. The digital chopper circuit 112 selectively chops or inverts a DAC digital input signal derived from the digital output stream Y[n] from the quantizer 104, and the analog chopper circuit 110 selectively chops or inverts a differential DAC output signal in the DSM feedback circuit for noise shaping by modulating DAC errors out of band.

As further described in FIG. 3 below, the integrator circuits 102 in one example include transconductance amplifiers with output capacitors to integrate the output current from the transconductance amplifier to provide a differential voltage output representing integration of the received integrator input signal voltage. Op amps or different types of integrator circuits 102 can be used in other examples. The third or final integrator circuit 102c in FIGS. 1 and 2 provides a differential output voltage signal to first and second quantizer inputs 124a and 124b of the quantizer 104. The quantizer 104 provides a digital output stream Y[n] at a quantizer output 126. The quantizer 104 in one example is a single bit analog to digital converter, such as a comparator circuit. The quantizer 104 compares the differential input voltage received from the final integrator stage 102c to a reference voltage to generate the digital output stream Y[n] corresponding to the analog input signal by quantifying the differential quantizer input signal responsive to a first clock signal CLK1, referred to herein as a quantizer clock signal. As the output of the forward circuit path of the DSM 100, the relative frequency of "1s" and "0s" in the output stream Y[n] corresponds to the input voltage VIN. In another example, a multi-bit analog to digital converter can be used as the quantizer 104 to provide a digital output stream Y[n] according to the quantizer clock signal CLK1.

The clock signal CLK1 is provided in one example by a clock circuit 160 at a relatively high over sampling rate, and the quantizer 104 provides the digital output stream Y[n] (DATA OUTPUT) to a counter or filter circuit 130 for decimation filtering to provide a multi-bit digital value 132 representative of the analog voltage input VIN. In one example, the circuit 130 is a counter accumulating a count of the "1s" in the digital data stream Y[n], with a reset circuit (not shown) to reset the counter circuit 130 at a rate below the frequency of the quantizer clock signal CLK1. The DSM 100 in this case operates on the summer signal at the first and second integrator inputs 121 to provide an integral output, and the illustrated succeeding integrator stages 102b and 102c provide further integration with each integrator input receiving a feedback signal from a corresponding DAC 108 in the example of FIGS. 1 and 2. The clock circuit 160 in one example synchronizes transitions of the clock signals CLK1 and CLK2. The resulting quantizer digital output stream Y[n] includes a series of "1" and "0" values which in steady state provides an alternating signal with a frequency generally proportional to the input voltage VIN, with the counter or filter circuit 130 providing the digital output value 132 according to the output stream Y[n].

The first or outer loop of the feedback circuit includes the first RZ DAC 108a with the preceding digital chopper circuit 112 receiving the quantizer output stream Y[n] and providing a single bit signal to a DAC input 140a. In this example, the first DAC 108a is a single bit DAC and the DAC input 140a receives a single bit DAC digital input signal 140a having two predetermined states. In other examples, multibit quantizers 104 and multibit DACs 108 may be used in combination with a multi-but digital chopper circuit 112. The digital chopper circuit 112 selectively inverts the digital output stream Y[n] of the quantizer 104 to provide the DAC digital input signal responsive to a the chopper clock signal CLK2 from the clock circuit 160. For a single bit digital output stream Y[n], the digital chopping circuit 112 in one example includes a multiplexer 114 and an inverter 116 to selectively apply a DAC input signal to the DAC input 140a. The inverter 116 provides an inverted data stream Y[n]' to one input of the multiplexer 114, and the unmodified data stream Y[n] is provided as another input the multiplexer 114. Based on the current state of the chopper clock CLK2, the multiplexer 114 provides either the unmodified digital output stream Y[n] or the inverted data stream Y[n]' to the DAC input 140a. In this manner, the digital chopper circuit 112 provides a digital modulator 112 to selectively invert the data stream in providing the input signal to the DAC. In some examples, the quantizer 104 provides a multi-bit (e.g., parallel) output data stream, with the DACs 106, 108 receiving multi-bit inputs and providing a corresponding analog output signal. In these examples, the digital chopping circuitry 112 selectively provides an inverted or converse multi-bit input to a multi-bit DAC 108a based on the state of the chopper clock CLK2.

The single-bit DAC 108a in FIGS. 1 and 2 includes a DAC input 140a to receive the DAC digital input signal from the digital chopper circuit 112. The DAC 108a provides a differential DAC output signal at first and second DAC outputs 142a and 142b that corresponds to the DAC digital input signal. The DAC outputs 142a and 144b are respectively connected to first and second inputs 143a and 143b of the analog chopper circuit 110a. First and second analog chopper outputs 144a and 144b provide a differential feedback signal VFB to the summer circuit for summation with the differential analog input signal VIN of the DSM 100. In operation, the analog chopper circuit 110a provides the differential feedback signal VFB according to the differential DAC output signal with alternating polarity responsive to the chopper clock signal CLK2. The clock circuit 160 in one example provides the second clock signal CLK2 at a lower switching frequency than the first clock signal CLK1. For example, the chopper clock signal CLK2 may be provided at a frequency significantly lower than the quantizer clock signal frequency.

The operation of the digital chopper circuit 112 and the analog chopper circuit 110a according to the chopper clock signal CLK2 up-modulates or noise-shapes offset and even order harmonic distortion associated with mismatches in the DAC 108a and moves this noise outside the band of the DSM 100. In contrast to calibrating mismatch errors during manufacturing, the feedback circuit of the DSM 100 and FIGS. 1 and 2 reduces or avoids manufacturing calibration to address such DAC error induced problems. In addition, the analog and digital chopper circuitry 110, 112 in the feedback circuit provides error correction in real time, and thus errors across temperature can be corrected or reduced without external intervention. The disclosed examples also up-modulate DAC switch flicker noise which cannot be addressed by manufacturing calibration steps.

In the example of FIG. 1, the digital output stream Y[n] is also provided to inputs 140b and 140c of additional RZ DACs 108b and 108c, respectively. The further DACs 108b and 108c provide differential analog feedback signals via corresponding outputs 146a, 146b and 148a, 148b to the input terminals 122a, 122b and 123a, 123b of the second and third integrator circuits 102b and 102c, respectively. The individual integrators 102b and 102c provide differential outputs to the succeeding forward path stage by integrating the differential signal from the preceding stage and any offset by the corresponding differential feedback signal. This example provides relatively low frequency chopping via the clock signal CLK2 for the outer feedback loop using the DAC 108a to up-modulate DAC error induced offset and even order harmonic distortion in the DSM 100.

In the example of FIG. 2, the further inner feedback loops including DACs 108b and 108c receive the digitally chopped output from the digital chopper circuit 112 at the corresponding DAC inputs 140b and 140c. Analog chopper circuits 110b and 110c are provided at the respective outputs of the inner-loop DACs 108b and 108c. The choppers 110b and 110c operate according to the chopper clock signal CLK2 to provide corresponding differential outputs to the inputs of the integrators 102b and 102c. In this manner, any offset or even order harmonic noise associated with mismatching in the inner-loop DACs 108b, 108c is noise shaped outside the DSM band.

Figure 3:
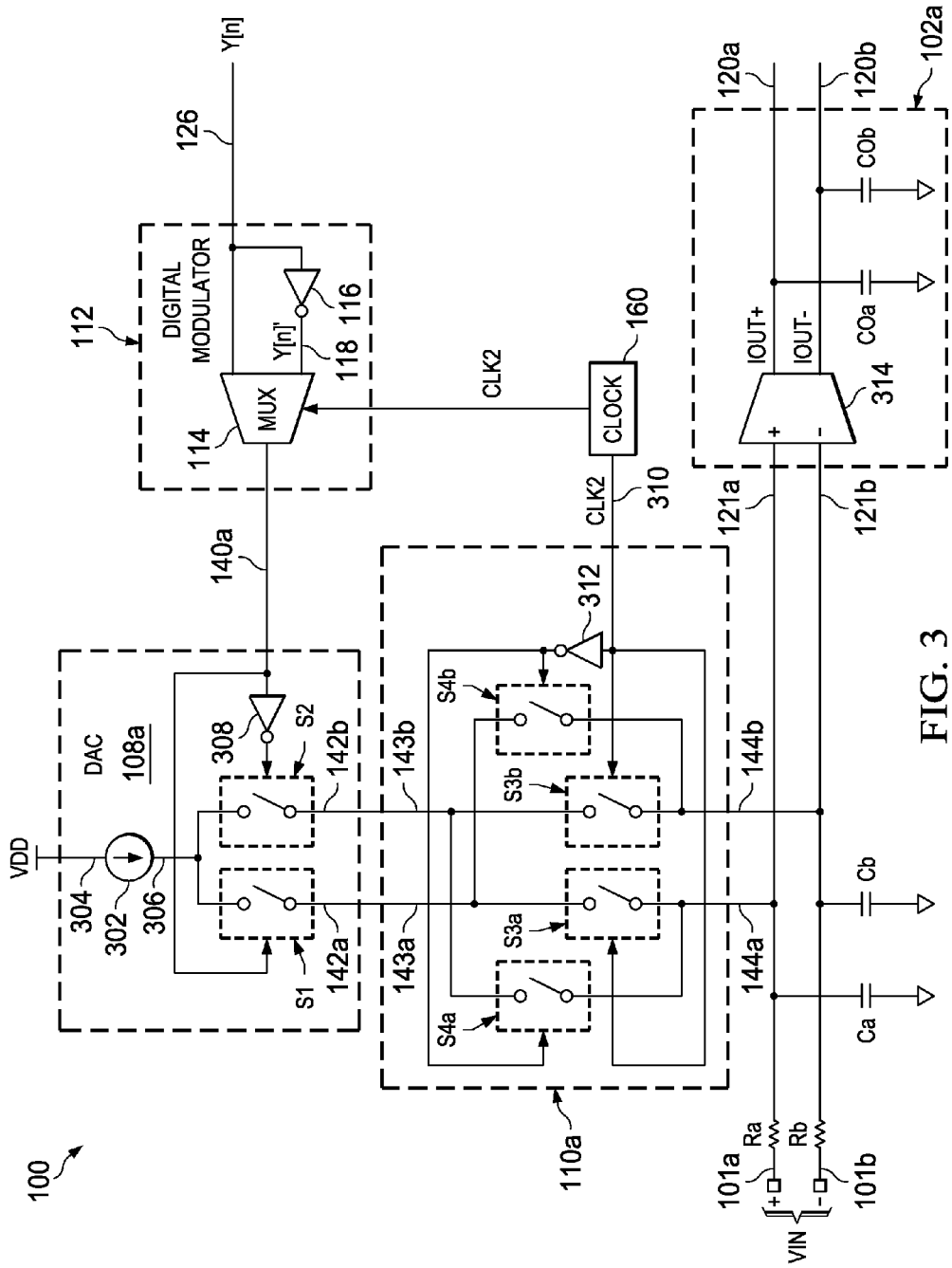
FIG. 3 is a schematic diagram showing details of digital and analog chopper circuit examples and a single bit DAC example in the DSMs of FIGS. 1 and 2.

FIG. 3 shows further details of example digital and analog chopper circuits 112 and 110a in combination with a single bit DAC 108a in the DSMs 100 of FIGS. 1 and 2. The first integrator 102a in this example includes a transconductance amplifier 314 with a first amplifier input coupled with the first integrator input 121a and a second amplifier input coupled with the second integrator input 121b. The transconductance amplifier 314 provides current outputs to the integrator outputs 120a (IOUT+) and 120b (IOUT−). In this example, the outputs 120a and 120b are respectively connected to output capacitors COa and COb with lower terminals connected to a signal ground to integrate the output currents to provide a differential output voltage across the outputs 120a and 120b.

The DAC 108a in FIG. 3 includes a current source 302 connected between a positive supply node VDD and a switching circuit input 306, as well as a first switch S1 operated according to the DAC digital input signal at the DAC input 140a, with an inverter 308 inverting the DAC input signal to control a second switch S2. S1 is closed to selectively allow current to flow from the current source 302 into the first DAC output 142a when the DAC digital input signal 140a is in a first state. S1 prevents current flow from the current source 302 into the first DAC output 142a when the DAC digital input signal 140a is in a different second state. The switch S2 is coupled between the current source 302 and the second DAC output 142b and operates to selectively allow current from the source 302 to flow into the output 142b when the DAC digital input signal 140a is in the second state, and S2 prevents current from the current source 302 from flowing into the output 142b when the signal 140a is in the first state. In certain examples, the DAC 108a is an RZ DAC having a reset state in which both switches S1 and S2 are open or off to prevent current from the source 302 into the DAC outputs 142.

The analog chopper circuit 110a in FIG. 3 includes first and second analog chopper inputs 143a and 143b which receive the differential DAC output signal from the first and second DAC output 142a and 142b. Also, the chopper circuit 110a includes a switching circuit formed by switches S3a, S3b, S4a and S4b to couple the first analog chopper input 143a with the first analog chopper output 144a and to couple the second analog chopper input 143b with the second analog chopper output 144b when the chopper clock signal CLK2 is in a first state. The switching circuit couples the first analog chopper input 143a with the second analog chopper output 144b and couples the second analog chopper input 143b with the first analog chopper output 144a and when CLK2 is in a different second state. In the illustrated example, S3a and S3b are closed when CLK2 is active high, and an inverter 312 provides an output to close S4a and S4b when CLK2 is low and vice versa. The clock circuit 160 provides a control signal CLK2 along line 310 to the analog chopper circuit 110a in FIG. 3.

The clock circuit 160 in FIG. 3 also provides the CLK2 signal as an input to the multiplexer 114 of the digital modulator (digital chopper) circuit 112 to selectively connect the unmodified digital output stream Y[n] from the quantizer output 126 or the inverted output stream Y[n]' to the DAC digital input 140a. The first and second analog chopper outputs 144a and 144b provide the resulting chopped differential feedback signal to the summer circuit for summation with the input voltage signal VIN to provide a differential input to the transconductance amplifier 314 of the first integrator circuit 102a along inputs 121a and 121b. In this manner, the digital chopper circuit 112 and the analog chopper circuit 110a operate in synchronous fashion to up-modulate DAC-related offset and even order harmonic distortion outside the DSM operating band.

Figure 4:
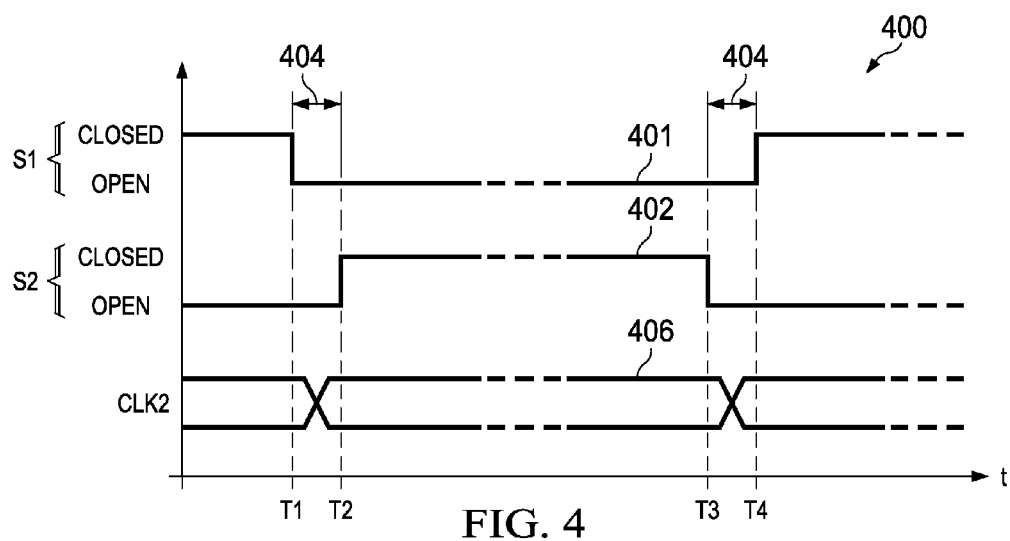
FIG. 4 is a graph of return to zero (RZ) DAC switching signals providing a reset period and transitioning of the chopper clock signal during the reset period of the DAC switching signals.

Referring now to FIGS. 3 and 4, a graph 400 in FIG. 4 shows return to zero DAC switching signals for 401 and 402 respectively corresponding to the switch states of S1 and S2. FIG. 4 also shows a curve 406 representing the chopper clock signal CLK2. In one example, the DAC switches S1 and S2 in FIG. 3 are operated in saturation mode when closed to provide a low impedance path for conducting current from the source 302. The first and second DAC outputs 142a and 142b provide a zero differential DAC output signal (e.g., both switches open or off) during a reset period 404 between transitions of the differential DAC output signal from one state to another. The reset period 404 has a non-zero duration. The graph 400 and FIG. 4 illustrates an initial reset period 404 between times T1 and T2, as well as a second example reset period 404 between T3 and T4 during which both switches S1 and S2 are closed to allow the DAC output to return to zero. The clock circuit 160 in this example provides transitions in the second clock signal CLK2 to change states of the analog and digital chopper circuits 110a and 112 only during the reset period 404 while the first and second DAC outputs 142a, 142b provide a zero differential DAC output signal. In one example, the analog chopper circuit switches S3 and S4 need not be driven into saturation, thereby conserving power. Also, the controlled transitioning of the CLK2 signal only during the reset period 404 prevents or mitigates the possibility of inadvertently shorting the DAC output signals or the transconductance amplifier inputs.

Figure 5:
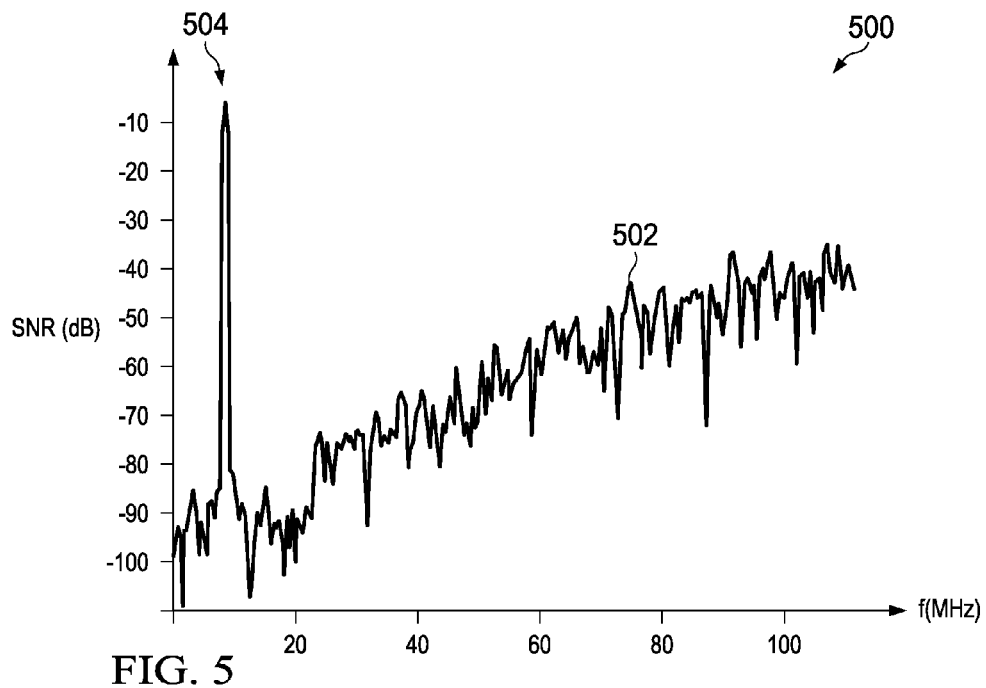
FIGS. 5 and 6 are signal to noise ratio (SNR) graphs with and without the feedback chopper circuits of FIG. 1 showing significant offset and even order harmonic reduction through noise shaping in the DSM of FIG. 1.
Figure 6:
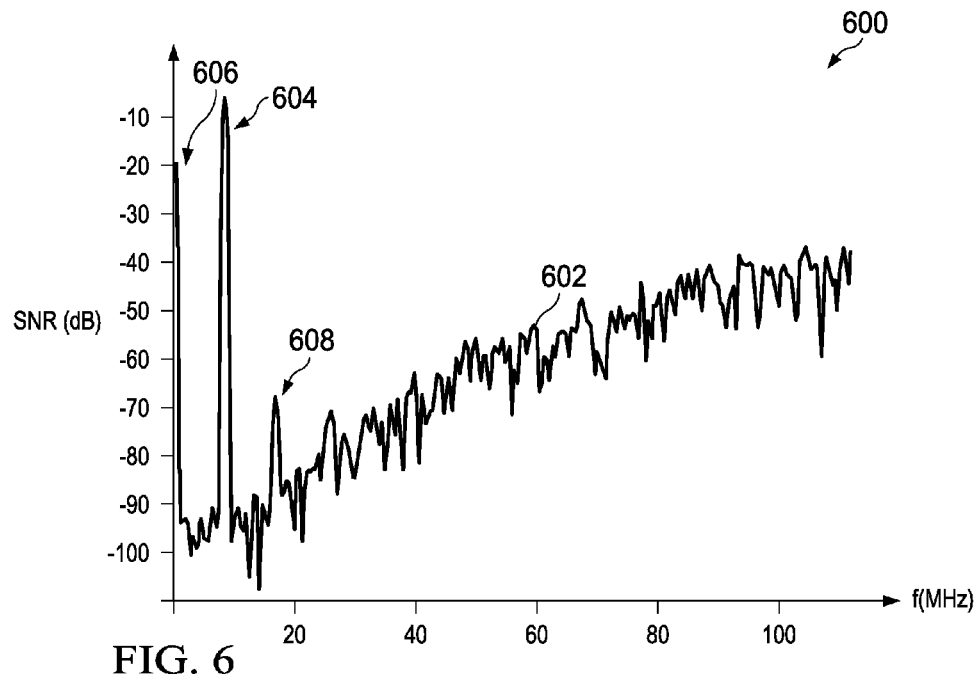
Figure 7:
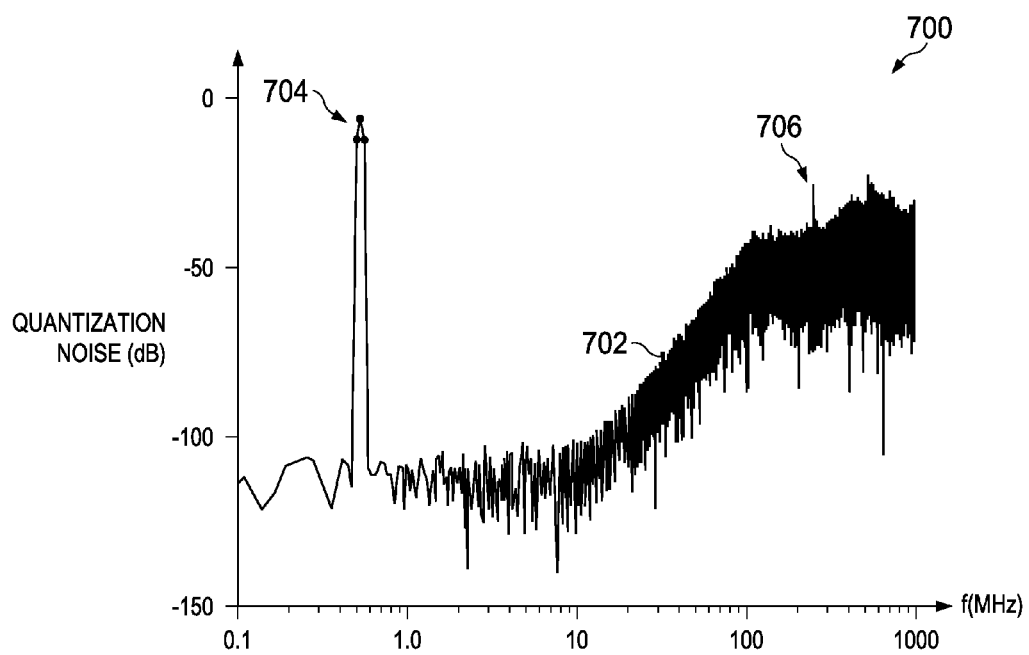
FIG. 7 is a graph of quantization noise as a function of frequency in the DSM of FIG. 1.

Referring now to FIGS. 5-7, graphs 500 and 600 in FIGS. 5 and 6 show signal to noise ratio (SNR) curves 502 and 602 as a function of operating frequency "f". The graph 500 in FIG. 5 shows operation with the feedback chopper circuits 112 and 110a in the DSM 100 of FIG. 1, and the graph 600 in FIG. 6 shows operation of the DSM 100 without chopper operation. Without the feedback chopper operation, the curve 602 in FIG. 6 includes a fundamental frequency component 604 as well as a relatively high DC or low frequency offset of about −19 dB at 606. In addition, the curve 602 includes a significant second order harmonic component shown at 608 of approximately −68 dB at approximately 18 MHz. As seen in FIG. 5, the operation of the feedback chopper circuitry 110a and 112 in the DSM 100 of FIG. 1 advantageously reduces the low-frequency offset and also significantly reduces the second and higher order even harmonic distortion in the DSM 100. FIG. 7 shows a graph 700 illustrating a quantization noise curve 702 for the DSM 100 of FIG. 1 as a function of frequency, including a fundamental component 704 (e.g., corresponding to the fundamental component 504 in FIG. 5), and further illustrates the up-modulation of the second order harmonics at 706 to relatively high frequency outside the band of operation of the DSM 100.

Figure 8:
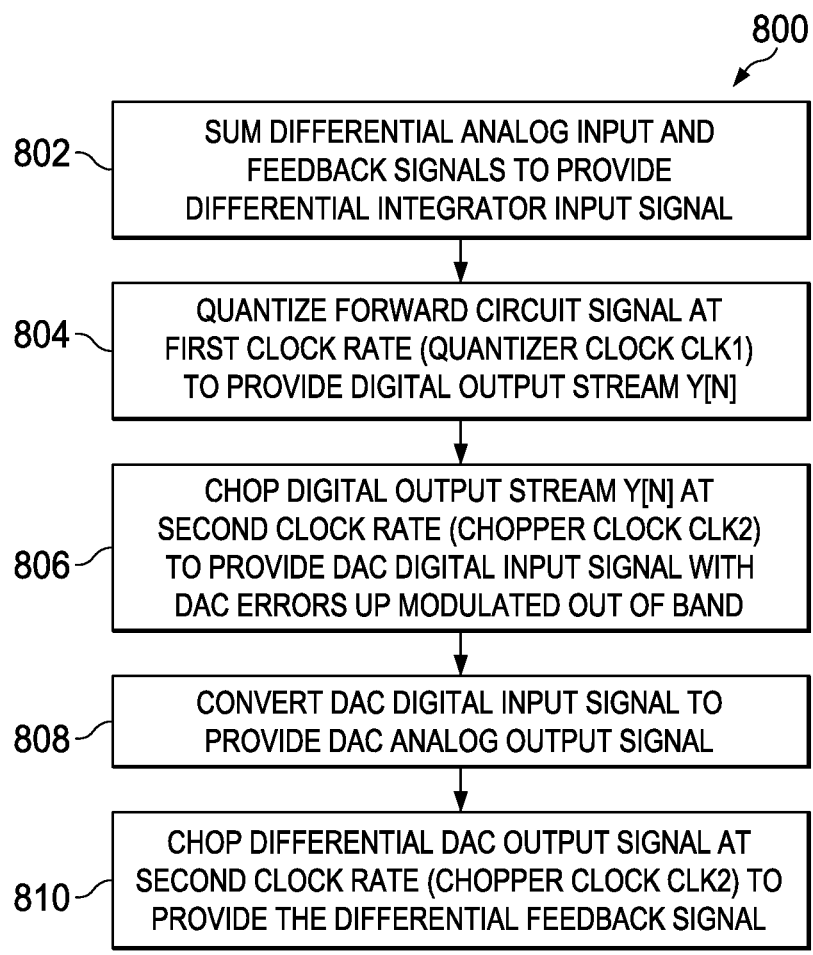
FIG. 8 is a flow diagram of a method for mitigating DAC error induced offset and even order harmonic distortion in a delta sigma modulator.

FIG. 8 depicts a process or method 800 that can be used to facilitate reduction or elimination of DAC-related offset and/or even order harmonic distortion in the output of a delta sigma modulator such as the DSM 100 of FIG. 1. At 802 in FIG. 8, a differential analog input signal (e.g., VIN) is summed with a differential feedback signal (VFB) to provide a differential integrator input signal. For example, the summation circuit in FIG. 1 sums the input voltage VIN with the feedback signal VFB from the feedback circuit in the DSM 100 to provide a differential signal at terminals 121a and 121b to the first integrator 102a. The summation can be additive or subtractive. For example, the summing circuit in FIG. 1 can subtract the feedback signal VFB from the input signal VIN at 802 in FIG. 8.

At 804 in FIG. 8, a differential signal of a forward circuit of the DSM 100 is quantized in response to a leading or trailing edge of a first clock signal (e.g., the quantizer clock signal CLK1 in FIG. 1) at a first clock rate to provide a digital output stream. At 806, the digital output stream is chopped using a digital modulator (e.g., digital chopper circuit 112 above) in response to a second clock signal CLK2 at a second clock rate lower than the first clock rate to provide a DAC digital input signal. For example, the single bit quantizer (e.g., comparator) 104 in FIG. 1 provides a digital output stream Y[n] for filtering or counting to generate an analog to digital converter output value 132 using a counter or filter circuit 130, and the digital modulator or chopper circuit 112 selectively inverts the single-bit quantizer output stream according to the chopper clock signal CLK2.

At 808 in FIG. 8, the DAC digital input signal is converted using a DAC (e.g., DAC 108a in FIG. 1) to provide a differential DAC output signal. The differential DAC output signal is chopped at 810 in FIG. 8 using an analog chopper circuit (e.g., analog chopper 110a) in response to the chopper clock signal CLK2 to provide the differential feedback signal VFB. In one example application, the method 800 may be employed to mitigate DAC error induced offset and even order harmonic distortion in the digital output stream Y[n] of the continuous time DSM 100.

In certain implementations, the method 800 further includes selectively transitioning the second clock signal CLK2 to change states of the analog chopper circuit 110a and the digital modulator 112 only during a reset period of a non-zero duration between transitions of the differential DAC output signal from one state to another while the differential DAC output signal is zero. For example, the clock circuit 160 in FIG. 1 transitions the chopper clock signal CLK2 only during a reset period 404 when both the DAC switches are off (e.g., switches S1 and S2) as shown in FIGS. 3 and 4 above.

Disclosed examples provide for up-modulation of DAC errors by analog and digital chopping via the circuits 110 and 112 to a higher (out of band) frequency. The noise shaping or up-modulation is not visible to the feedback signal, and only the errors associated with the corresponding feedback DAC 108 are chopped. The disclosed examples may be employed to remove DAC mismatch errors in the modulator without affecting the forward signal path. The up-modulated errors are filtered in the decimation digital filter or counter 130 in similar fashion to out of band quantization noise. Also, the disclosed examples provide error correction in the background so performance is good across process corners and temperature, and real-time errors are removed with the addition of small additional digital circuitry. Furthermore, the disclosed examples do not require factory calibration or additional component cost and space required for fabrication trimming of offsets as used in other solutions.

The above examples are merely illustrative of several possible embodiments of various aspects of the present disclosure, wherein equivalent alterations and/or modifications will occur to others skilled in the art upon reading and understanding this specification and the annexed drawings. Modifica- The following is claimed:

1. A delta sigma modulator (DSM), comprising:
   a summer circuit operative to sum a differential analog input signal and a differential feedback signal, and to provide a differential summer output signal;
   a first integrator in a forward circuit, the first integrator including: first and second integrator inputs to receive the differential summer output signal, and first and second integrator outputs to provide a first differential integrator output signal;
   a quantizer connected after the first integrator in the forward circuit path, the quantizer including: first and second quantizer inputs to receive a differential quantizer input signal, and a quantizer output to provide a digital output stream corresponding to the analog input signal by quantifying the differential quantizer input signal responsive to a first clock signal;
   a first digital to analog converter (DAC) in a feedback circuit forming a closed loop around the forward circuit, the first DAC including: a DAC input to receive a DAC digital input signal, and first and second DAC outputs to provide a differential DAC output signal corresponding to the DAC digital input signal;
   an analog chopper circuit in the feedback circuit between with the first DAC and the summer circuit, the analog chopper circuit operative to provide the differential feedback signal to the summer circuit according to the differential DAC output signal with alternating polarity responsive to a second clock signal; and
   a digital chopper circuit coupled in the feedback circuit between the quantizer output and the DAC input to selectively invert the digital output stream to provide the DAC digital input signal responsive to the second clock signal.

2. The DSM of claim 1, wherein the analog chopper circuit comprises:
   first and second analog chopper inputs to receive the differential DAC output signal, the first analog chopper input being coupled with the first DAC output and the second analog chopper input being coupled with the second DAC output;
   first and second analog chopper outputs to provide the differential feedback signal to the summer circuit; and
   a first switching circuit including a plurality of switches operative when the second clock signal is in a first state to couple the first analog chopper input with the first analog chopper output and to couple the second analog chopper input with the second analog chopper output, and when the second clock signal is in a second state to couple the first analog chopper input with the second analog chopper output and to couple the second analog chopper input with the first analog chopper output.

3. The DSM of claim 1, comprising a clock circuit to provide the second clock signal at a lower switching frequency than the first clock signal.

4. The DSM of claim 3, wherein the first and second DAC outputs are operative to provide a zero differential DAC output signal during a reset period of a non-zero duration between transitions of the differential DAC output signal from one state to another, and wherein the clock circuit is operative to provide transitions in the second clock signal to change states of the analog and digital chopper circuits only during the reset period while the first and second DAC outputs provide a zero differential DAC output signal.

5. The DSM of claim 1, wherein the first DAC is a single bit DAC, and wherein the DAC input is operative to receive a single bit DAC digital input signal having two predetermined states.

6. The DSM of claim 5:
   wherein the first integrator comprises a transconductance amplifier including a first amplifier input coupled with the first integrator input, and a second amplifier input coupled with the second integrator input; and
   wherein the first DAC comprises:
   a current source,
   a first switch coupled between the current source and the first DAC output, the first switch being operative to selectively allow current from the current source to flow into the first DAC output when the DAC digital input signal is in a first state, and to prevent current from the current source from flowing into the first DAC output when the DAC digital input signal is in a different second state, and
   a second switch coupled between the current source and the second DAC output, the second switch being operative to selectively allow current from the current source to flow into the second DAC output when the DAC digital input signal is in the second state, and to prevent current from the current source from flowing into the second DAC output when the DAC digital input signal is in the first state.

7. The DSM of claim 1:
   wherein the first integrator comprises a transconductance amplifier including a first amplifier input coupled with the first integrator input, and a second amplifier input coupled with the second integrator input; and
   wherein the first DAC comprises:
   a current source,
   a first switch coupled between the current source and the first DAC output, the first switch being operative to selectively allow current from the current source to flow into the first DAC output when the DAC digital input signal is in a first state, and to prevent current from the current source from flowing into the first DAC output when the DAC digital input signal is in a different second state, and
   a second switch coupled between the current source and the second DAC output, the second switch being operative to selectively allow current from the current source to flow into the second DAC output when the DAC digital input signal is in the second state, and to prevent current from the current source from flowing into the second DAC output when the DAC digital input signal is in the first state.

8. The DSM of claim 7, wherein the first and second DAC outputs are operative to provide a zero differential DAC output signal during a reset period of a non-zero duration between transitions of the differential DAC output signal from one state to another, the DSM comprising a clock circuit to provide transitions in the second clock signal to change states of the analog and digital chopper circuits only during the reset period while the first and second DAC outputs provide a zero differential DAC output signal.

9. The DSM of claim 7, wherein the analog chopper circuit comprises:
  first and second analog chopper inputs to receive the differential DAC output signal, the first analog chopper input being coupled with the first DAC output and the second analog chopper input being coupled with the second DAC output;
  first and second analog chopper outputs to provide the differential feedback signal to the summer circuit; and
  a first switching circuit including a plurality of switches operative when the second clock signal is in a first state to couple the first analog chopper input with the first analog chopper output and to couple the second analog chopper input with the second analog chopper output, and when the second clock signal is in a second state to couple the first analog chopper input with the second analog chopper output and to couple the second analog chopper input with the first analog chopper output.

10. The DSM of claim 1, wherein the first and second DAC outputs are operative to provide a zero differential DAC output signal during a reset period of a non-zero duration between transitions of the differential DAC output signal from one state to another, the DSM comprising a clock circuit to provide transitions in the second clock signal to change states of the analog and digital chopper circuits only during the reset period while the first and second DAC outputs provide a zero differential DAC output signal.

11. The DSM of claim 1, comprising:
  at least one further integrator connected in the forward circuit between the first integrator and the quantizer; and
  at least one further DAC in the feedback circuit to receive one of the DAC digital input signal and the digital output stream, and to provide a differential further DAC output signal to an input of the further integrator.

12. An apparatus to mitigate digital to analog converter (DAC) error induced offset and even order harmonic distortion in a continuous time delta sigma modulator (DSM), comprising:
  a digital chopper circuit coupled in a feedback circuit of the DSM to selectively invert a digital output stream of a quantizer of the DSM to provide a DAC digital input signal responsive to a chopper clock signal;
  a DAC, including:
  a DAC input to receive the DAC digital input signal from the digital chopper circuit, and
  first and second DAC outputs to provide a differential DAC output signal corresponding to the DAC digital input signal; and
  an analog chopper circuit to provide a differential feedback signal to a summer circuit for summation with a differential analog input signal of the DSM, the analog chopper circuit providing the differential feedback signal according to the differential DAC output signal with alternating polarity responsive to the chopper clock signal.

13. The apparatus of claim 12, wherein the analog chopper circuit comprises:
  first and second analog chopper inputs to receive the differential DAC output signal;
  first and second analog chopper outputs to provide the differential feedback signal; and
  a switching circuit operative when the chopper clock signal is in a first state to couple the first analog chopper input with the first analog chopper output and to couple the second analog chopper input with the second analog chopper output, the switching circuit operative when the chopper clock signal is in a second state to couple the first analog chopper input with the second analog chopper output and to couple the second analog chopper input with the first analog chopper output.

14. The apparatus of claim 12, comprising a clock circuit to provide the chopper clock signal at a lower switching frequency than a quantizer clock signal operating the quantizer of the DSM.

15. The apparatus of claim 14, wherein the first and second DAC outputs are operative to provide a zero differential DAC output signal during a reset period of a non-zero duration between transitions of the differential DAC output signal from one state to another, and wherein the clock circuit is operative to provide transitions in the chopper clock signal to change states of the analog and digital chopper circuits only during the reset period while the first and second DAC outputs provide a zero differential DAC output signal.

16. The apparatus of claim 12, wherein the DAC comprises:
  a current source;
  a first switch to selectively allow current from the current source to flow into the first DAC output when the DAC digital input signal is in a first state, and to prevent current from the current source from flowing into the first DAC output when the DAC digital input signal is in a different second state; and
  a second switch to selectively allow current from the current source to flow into the second DAC output when the DAC digital input signal is in the second state, and to prevent current from the current source from flowing into the second DAC output when the DAC digital input signal is in the first state.

17. The apparatus of claim 16, wherein the first and second DAC outputs are operative to provide a zero differential DAC output signal during a reset period of a non-zero duration between transitions of the differential DAC output signal from one state to another, the apparatus comprising a clock circuit to provide transitions in the chopper clock signal to change states of the analog and digital chopper circuits only during the reset period while the first and second DAC outputs provide a zero differential DAC output signal.

18. The apparatus of claim 12, wherein the first and second DAC outputs are operative to provide a zero differential DAC output signal during a reset period of a non-zero duration between transitions of the differential DAC output signal from one state to another, the apparatus comprising a clock circuit to provide transitions in the chopper clock signal to change states of the analog and digital chopper circuits only during the reset period while the first and second DAC outputs provide a zero differential DAC output signal.

19. A method of mitigating digital to analog converter (DAC) error induced offset and even order harmonic distortion in a continuous time delta sigma modulator (DSM), the method comprising:
  summing a differential analog input signal and a differential feedback signal to provide a differential integrator input signal;
  quantizing a differential signal of a forward circuit of the DSM responsive to a first clock signal at a first clock rate to provide a digital output stream;
  chopping the digital output stream using a digital modulator responsive to a second clock signal at a second clock rate lower than the first clock rate to provide a DAC digital input signal;
  converting the DAC digital input signal using a DAC to provide a DAC analog output signal; and chopping a differential DAC output signal using an analog chopper circuit responsive to the second clock signal to provide the differential feedback signal to mitigate DAC error induced offset and even order harmonic distortion in the digital output stream of the continuous time DSM.

20. The method of claim 19, comprising transitioning the second clock signal to change states of the analog chopper circuit and the digital modulator only during a reset period of a non-zero duration between transitions of the differential DAC output signal from one state to another while the differential DAC output signal is zero.

* * * * *